United States Patent [19]

Stankus et al.

[11] Patent Number: 4,761,880
[45] Date of Patent: Aug. 9, 1988

[54] METHOD OF OBTAINING SURFACE MOUNT COMPONENT PLANARITY

[75] Inventors: John J. Stankus, Austin; Boyd M. Fry, Georgetown, both of Tex.

[73] Assignee: International Business Machines Corporation, Armonk, N.Y.

[21] Appl. No.: 938,950

[22] Filed: Dec. 8, 1986

[51] Int. Cl.⁴ .................................. H05K 3/34
[52] U.S. Cl. ...................... 29/840; 228/255; 29/843
[58] Field of Search ............. 29/843, 840; 228/255, 228/41, 246

[56] References Cited

U.S. PATENT DOCUMENTS 3,657,789  4/1972  Anglade ..................... 228/255 X
3,913,818  10/1975  Osipov et al. ............... 228/255 X
4,505,035  3/1985  Burton et al. ............... 29/843

FOREIGN PATENT DOCUMENTS 694985  12/1979  U.S.S.R. ..................... 29/840

Primary Examiner—Howard N. Goldberg
Assistant Examiner—Carl J. Arbes
Attorney, Agent, or Firm—Andrea P. Bryant

[57] ABSTRACT

A packaging technique for finely leaded electronic devices for attachment by surface methods to printed circuit boards is disclosed wherein the leads are imbedded in solder foil prior to the completion of lead forming operations so as to maintain planarity of the leads and to prevent damage thereto during handling, placement and attachment processes.

6 Claims, 2 Drawing Sheets

METHOD OF OBTAINING SURFACE MOUNT COMPONENT PLANARITY

DESCRIPTION

1. Technical Field

The present invention relates to electronic device leading packaging and an assembly process for insuring uniform lead planarity. More particularly it relates to maintaining the planarity of fine pitch leads by preattaching solder before the lead formation process is complete.

2. Background Art

Advances in electronic device chip technology provide higher density circuit packages. Higher density packaging creates an increased demand for higher I/O at the module component packaging level and/or card package levels. The use of surface mount technology allows for higher density than pin in hole component leads. Smaller leads with more stringent dimensional tolerances necessitate special handling considerations so as not to damage the leads or destroy their planarity during processing.

Conventional methods for assembling surface mount components onto printed circuit substrates include applying solder paste to the circuit board in a predetermined pattern corresponding to the lead pattern of the components. Frequently, paste is applied through a stencil. Components are then placed on their respective solder pads and the whole is then subjected to heat to reflow the solder. Good registration between component leads and the solder pads on the substrate is essential for acceptable, reliable soldered joints.

With high density very fine component leads, the current standard assembly methods have short comings. The delicacy of the leads, enhances the opportunity for easy damage or distortion of their planarity. Since leads must be in alignment in the X, Y and Z directions to assure satisfactory solder joints, it becomes increasingly important to maintain that alignment for high yields.

U.S. Pat. No. 4,505,035 to Burton et al relates to methods of aligning and mounting of plurality of electrical leads to a plurality of terminals and discloses aligning of leads by urging them into spaced grooves of a workholder and subsequently forming a deformable material, such as a solder wire, between and across each of the leads to retain established spaces there between.

It is known and practiced in the industry to leave lead frame material connected to leads of edge connectors until after the leads are attached to the substrate. The excess lead frame material is then removed.

DISCLOSURE OF THE INVENTION

The present invention overcomes the shortcomings noted above in the prior art by providing a packaging methodology which includes applying solder in the form of a foil to fine leads of surface mountable components before the leads are completely formed and separated from the surrounding matrix hereinafter called kerf, of lead material. The leads are held planar for subsequent processing steps including a forming or bend step and the placement process on the substrate.

BRIEF DESCRIPTION OF THE DRAWING

The present invention will be better understood from the following description taken in connection with the accompanying drawing wherein.

DESCRIPTION OF THE EMBODIMENT

Figure 1:
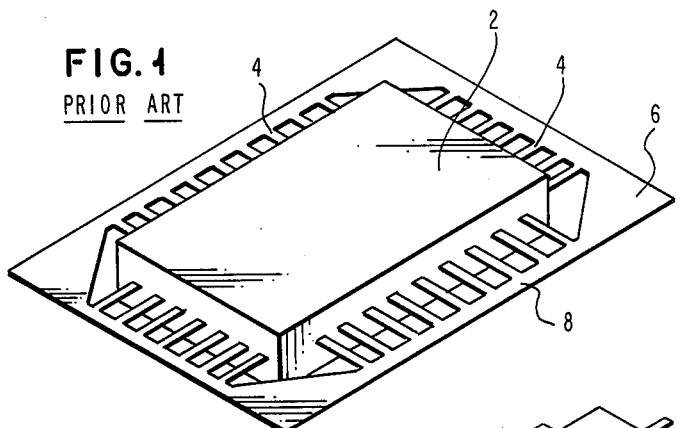
FIG. 1 shows a component prior to lead forming and kerf removal.
Figure 2:
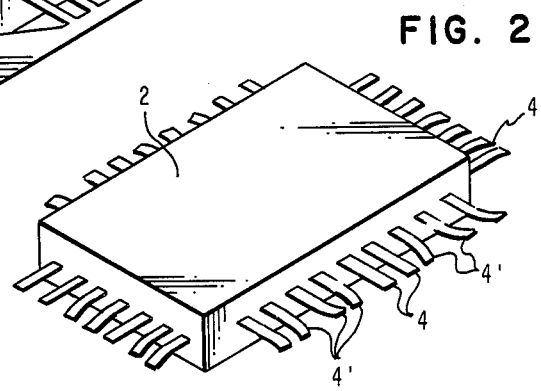
FIG. 2 shows the same component after lead forming and kerf removal.

Refer first to FIGS. 1 and 2 which are illustrative of prior art component packaging methods. FIG. 1 shows a component with its leads incompletely formed, that is the excess lead material matrix, kerf, from which the leads are stamped or otherwise formed is not removed. In FIG. 1 the component is indicated at 2. Individual leads 4 extend from each side of the component 2. Leads 4 are connected to each other by kerf 8. The corners of the kerf are shown at 6.

FIG. 2 shows the same component 2 after leads 4 are bent and the excess kerf section 8 has been removed. When this prior art technique is used with very fine leads, it becomes clear that their fragility dictates extreme caution in handling during manufacture shipment and subsequent process steps for attaching, that is pick, place and attach to the printed circuit borad. Thus, some of the leads 4' are shown already misaligned and no longer planar.

Figure 3:
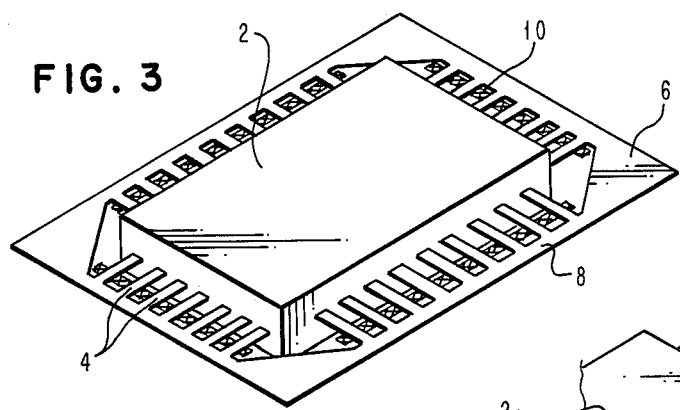
FIG. 3 shows a component prior to lead forming after solder foil is positioned for pressure forming on the leads.

FIG. 3 is similar to FIG. 1. However, in accordance with the invention solder foil 10 has been positioned for pressure forming to leads 4 while kerf sections 6 and 8 remain attached thereto.

It has been found that cold compression molding is a preferred technique although other means for applying the solder foil to the leads are acceptable. The critical process parameters relate to the pressure employed and a settling time for achieving adequate flow of the solder material around the component leads.

Figure 4:
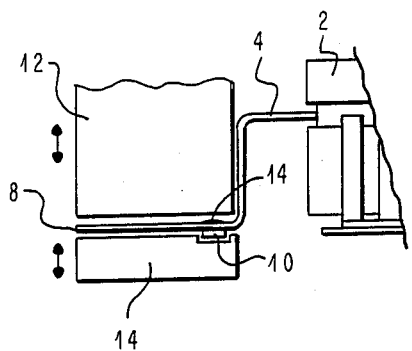
FIG. 4 shows a component with formed leads after solder pressure forming.

In one exemplary implementation a solder foil composition of 63/37 eutectic tin lead was used. Solder composition may vary in both constituents and alloy percentages as long as the foil has suitable malleability to compression form about the leads 4. Solder thickness was 0.003 to 0.008 inches. Thickness may vary, but is a function of the lead and corresponding printed circuit pad dimensions as well as the actual amount of solder required for satisfactory bonding. Using a typical component lead width of 0.015 inches (approximately 0.35 millimeters) and a pitch, that is lead center to lead center distance, of 0.031 inches (approximately 0.8 millimeters) and solder foil width of 0.04 inches (approximately 1 millimeter) the following critical parameters apply. Pressure of about 1 to 5 lbs. per square inch per lead and a pressure apply rate of 0.1 to 0.5 inches per second for a dwell time of approximately 1 to 5 seconds is appropriate. The dwell time is a function of alloy and solder hardness. The above data pertains to a process run at ambient temperature. The use of higher temperatures would, of course, reduce the dwell time and pressure required as well as increase the rate of applying pressure in most cases. FIG. 4 is a partial cross sectional view of component 2 with formed leads 4 from one side in between elements of pressure forming apparatus. Top element 12 and base 14 more vertically relative to each other to compress solder foil 10 about leads 4. In FIG. 4, compression has occurred and component 2 is ready for removal from the pressure forming apparatus. As a result of the pressure forming solder foil 10 is deformed and at 14 extends up between the leads 4.

Alternatively, the solder pressure forming step may occur before lead forming. The two steps may also be performed simultaneously.

Figure 5:
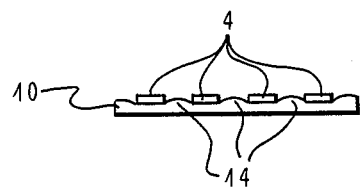
FIG. 5 is a schematic detail of the leads after solder foil is pressure formed thereon.

FIG. 5 is an exploded view of some leads 4 after solder 10 has been cold pressure formed and shows those portions 14 of solder foil 10 more clearly.

Once the leads are fixed in the solder, the device is rigid enough to withstand subsequent handling. Lead formation, before, after or during solder pressure forming apparatus and techniques. Prior art methods are satisfactory because the concern of damaging the fragile leads has been reduced since kerf sections 6 and 8 remain attached.

Figure 6:
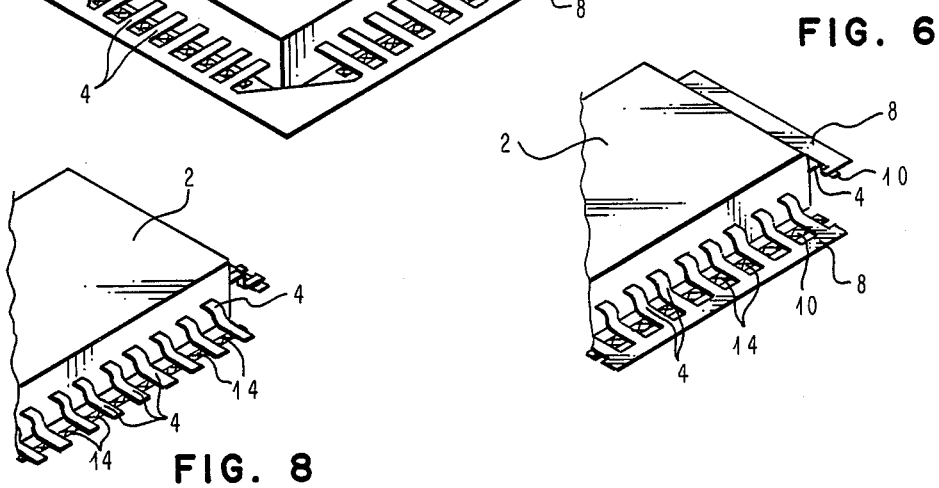
FIG. 6 shows a component of FIG. 3 after the leads, still attached to the kerf, are formed.

FIG. 6 is a perspective view of component 2 after removal from the solder pressure forming apparatus.

Figure 8:
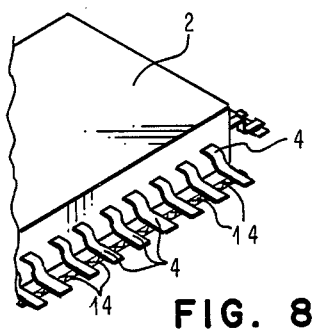
FIG. 8 shows a component ready for attachment.
Figure 7:
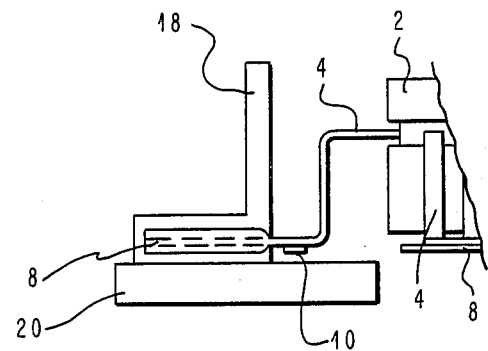
FIG. 7 is an enlarged schematic illustrating the kerf removal process.

Kerf sections 8 are removed by suitable shearing apparatus as illustratively shown in FIG. 7. A shearing tool having a cutting element 18 and base 20 is schematically shown with kerf section 8 positioned therebetween. After shearing, component 2, as shown in FIG. 8 is ready for attachment using conventional techniques with out danger of disturbing lead planarity.

Conventional placement techniques are used to position the device over land pads on printed circuit boards where applied flux assists in maintaining position until the solder is reflowed.

While the present invention has been described with reference to a particular preferred embodiment, those skilled in the art will understand that the above and other modifications in the form and detail may be made without departing from the scope of the invention.

What is claimed is:

1. A method of insuring lead planarity in leaded surface mountable components comprising sequentially:
   applying by pressure forming a web of electrically conductive material to the leads prior to their separation from a matrix of lead material;
   shaping leads into a predetermined configuration; and
   removing the excess lead material matrix.

2. The method of claim 1 wherein the applying step includes: cold forming the web onto and around the leads.

3. The method of claims 1 or 2 wherein the web is a solder foil.

4. A method of applying solder to leaded components comprising the sequential steps of:
   (a) cold pressure forming a web of solder onto the leads attached to lead frame material; and
   (b) removing the lead frame material.

5. The method of claim 4 including the additional step of:
   forming the leads into a predetermined configuration before step (a).

6. The method of claim 4, including the additional step of:
   forming the leads into a predetermined configuration before step (b).

* * * * *